(12) United States Patent
Qin et al.

(10) Patent No.: US 8,723,585 B2
(45) Date of Patent: May 13, 2014

(54) LEVEL SHIFT CIRCUIT

(75) Inventors: Zhengcai Qin, Shanghai (CN); Qifu Liu, Shanghai (CN); Nan Liu, Shanghai (CN); Dajun Wu, Shanghai (CN); Chengjie Zhou, Shanghai (CN); Ning Lu, Shanghai (CN); Ding Xu, Shanghai (CN)

(73) Assignee: Shanghai Belling Corp., Ltd., Shanghai (CN)

( * ) Notice: Subject to any disclaimer, the term of this patent is extended or adjusted under 35 U.S.C. 154(b) by 0 days.

(21) Appl. No.: 13/991,714

(22) PCT Filed: Dec. 8, 2010

(86) PCT No.: PCT/CN2010/079553
§ 371 (c)(1),
(2), (4) Date: Jun. 5, 2013

(87) PCT Pub. No.: WO2012/075627
PCT Pub. Date: Jun. 14, 2012

(65) Prior Publication Data
US 2013/0249617 A1    Sep. 26, 2013

(51) Int. Cl.
*H03L 5/00* (2006.01)
(52) U.S. Cl.
USPC ............... 327/333; 326/62; 326/63; 326/68
(58) Field of Classification Search
USPC ............ 326/62, 63, 68, 80, 81, 319; 327/333; 365/189.11
See application file for complete search history.

(56) References Cited

U.S. PATENT DOCUMENTS

| | | | | |
|---|---|---|---|---|
| 6,545,917 B2* | 4/2003 | Kim | ............... | 365/189.08 |
| 6,826,092 B2* | 11/2004 | Ho et al. | ............... | 365/189.05 |
| 7,209,333 B2* | 4/2007 | Lee et al. | ............... | 361/90 |
| 7,307,898 B2* | 12/2007 | Ng et al. | ............... | 365/189.09 |
| 7,791,371 B2* | 9/2010 | Nakazono | ............... | 326/68 |
| 2001/0017606 A1* | 8/2001 | Choi | ............... | 345/60 |
| 2001/0017608 A1* | 8/2001 | Kogure et al. | ............... | 345/87 |
| 2006/0001449 A1* | 1/2006 | Bhattacharya et al. | ............... | 326/81 |

(Continued)

FOREIGN PATENT DOCUMENTS

| | | |
|---|---|---|
| CN | 101086585 | 12/2007 |
| CN | 101383131 | 3/2009 |
| JP | 8-79053 | 3/1996 |
| WO | WO 2010/058469 | 5/2010 |

OTHER PUBLICATIONS

International Search Report for PCT/CN2010/079553 mailed Sep. 15, 2011.

*Primary Examiner* — Brandon S Cole
(74) *Attorney, Agent, or Firm* — Nixon & Vanderhye, P.C.

(57) ABSTRACT

Provided is a level shift circuit which includes: a first level shift module; a first signal input terminal for providing a first input signal for the first level shift module; a first signal output terminal for providing output from the first level shift module; a second level shift module; a second signal input terminal for providing a second input signal for the second level shift module; a second signal output terminal for providing output from the second level shift module; a drive module connected to the first signal output terminal and the second signal output terminal; and a drive signal output terminal from the drive module. The level shift circuit of the present invention can be applicable for the requirements of BCD process and prevent damages to the high-voltage device due to the excessively high gate voltage.

9 Claims, 4 Drawing Sheets

(56) References Cited

U.S. PATENT DOCUMENTS

| | | |
|---|---|---|
| 2006/0125811 A1 | 6/2006 | Moon et al. |
| 2006/0192587 A1* | 8/2006 | Bhattacharya et al. ......... 326/80 |
| 2007/0176635 A1* | 8/2007 | Bhattacharya et al. ......... 326/80 |
| 2007/0285381 A1 | 12/2007 | Gong et al. |
| 2009/0058773 A1 | 3/2009 | Chang |
| 2009/0160524 A1* | 6/2009 | Theus et al. .................. 327/333 |
| 2009/0315609 A1* | 12/2009 | Nakazono ..................... 327/333 |
| 2010/0109742 A1* | 5/2010 | Honda .......................... 327/333 |
| 2013/0021085 A1* | 1/2013 | Kumar et al. ................. 327/333 |

* cited by examiner

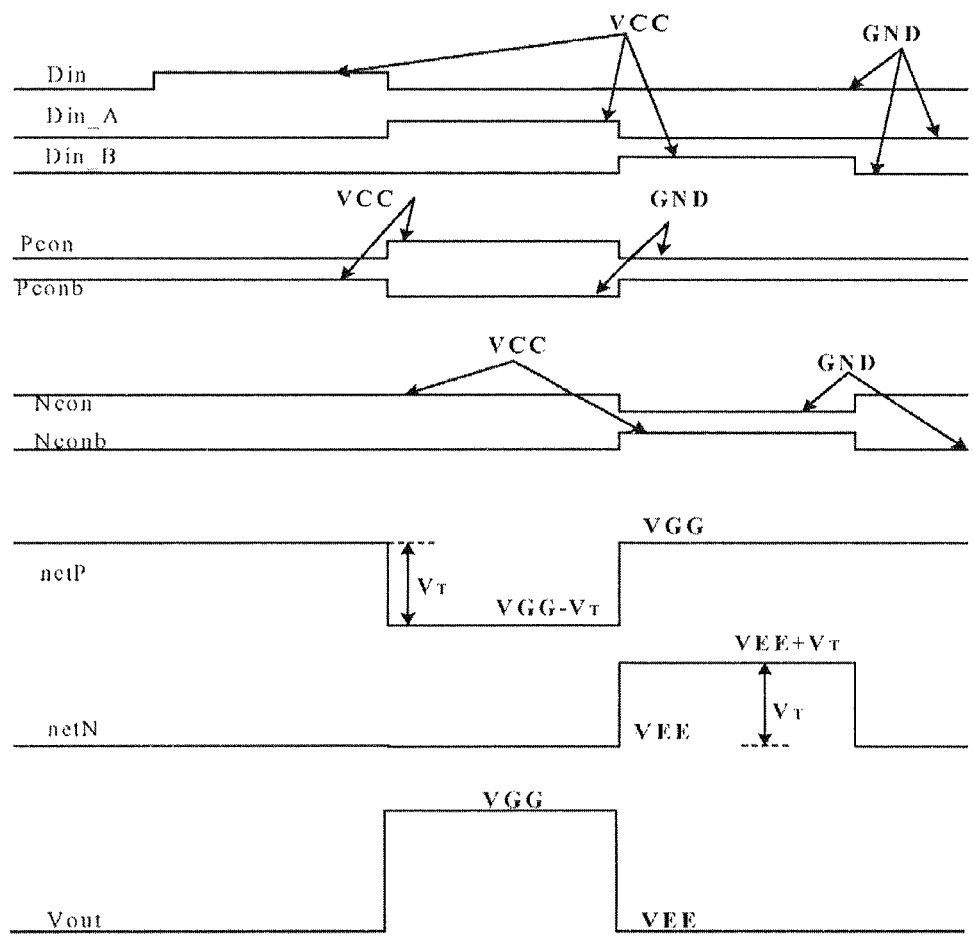

LEVEL SHIFT CIRCUIT

This application is the U.S. national phase of International Application No. PCT/CN2010/079553 filed 8 Dec. 2010 which designated the U.S., the entire contents of which is hereby incorporated by reference.

TECHNICAL FIELD

The present invention relates to the shift of voltage level, and more specifically, to a level shift circuit for a gate driver circuit in a LCD display.

BACKGROUND ART

At present, most of the drive circuits for the large-sized TFT-LCDs (Thin Film Transistor Liquid Crystal Display) are substantially developed by using the high-voltage (HV) CMOS (Complementary Metal Oxide Semiconductor) process. The gate drive circuit comprises a plurality of output channel circuits, wherein each output channel consists of a low-voltage logical combination circuit, a level shift circuit and a high-voltage output circuit. The advantages of the HV CMOS process are that, in the line(gate) drive circuit, the high-voltage output circuit of the output channel is simple, and the level shift is easily implemented.

FIG. 1 shows a level shift circuit in an output channel of a conventional line(gate) drive chip. As shown in the figure, $V_{IN}$ is an input drive signal; $V_{OUT}$ is an output drive signal; $V_{CC}$ is a low-potential power supply voltage; $V_{GG}/V_{EE}$ is the high-potential voltage/ground. MP1-MP4 and MN1-MN4 constitute the level shift circuit, and MP5 and MN5 constitute the output drive circuit.

When HV MOS process is adopted, the high-voltage device in the output channel circuit has a large threshold voltage and a small transconductance, resulting in a large on-resistance, which limits the reduction in area of the chip and the increase in operating power of the chip. In contrast, the BCD process, which integrates the Bipolar devices, CMOS devices, and DMOS (double-diffused metal oxide semiconductor) devices, has the advantages of high integration, low power consumption, and small chip area, etc. It is particularly important that the LDMOS (lateral double-diffused metal oxide semiconductor) devices used in the BCD process have a large transconductance and a small on-resistance.

Compared with the high-voltage devices of the conventional HV CMOS process, the high-voltage devices of the BCD process have a small gate-source breakdown voltage. Therefore, during the application of the BCD process, the use of the above level shift circuit having the conventional structure as shown in FIG. 1 will cause the damages to the devices, and thus the functions of the chip cannot he normally achieved.

Therefore, anew structure for the level shift circuit is needed, so as to effectively avoid the occurrence of the phenomenon in which the high-voltage devices in the BCD process are broken down due to the excessively high gate voltage, and to stably realize the shift between the high and low voltage levels in the channel.

SUMMARY OF THE INVENTION

An object of the present invention is to provide a level shift circuit based on BCD process, which can meet the requirements of the specific properties of the devices in the BCD process.

In order to achieve this object, the level shift circuit of the present invention comprises: a first level shift module; a first signal input terminal for providing a first input signal for the first level shift module; a first signal output terminal for providing output from the first level shift module; a second level shift module; a second signal input terminal for providing a second input signal for the second level shift module; a second signal output terminal for providing output from the second level shift module; a drive module connected to the first signal output terminal and the second signal output terminal; and a drive signal output terminal from the drive module; wherein, the first level shift module comprises: a first transistor having a gate connected to the first signal output terminal and a source connected to a low-voltage ground reference voltage source; a second transistor having a gate connected to its drain and a source connected to a high-voltage reference voltage source; a third transistor having a gate connected to the gate of the second transistor, a source connected to the high-voltage reference voltage source, and a drain connected to the drain of the first transistor and the first signal output terminal; a fourth transistor having a gate connected to a second complementary signal input terminal for inputting a second complementary signal and a drain connected to the drain of the second transistor, wherein the second complementary signal is complementary to the second input signal; a first clamping module having one end connected to the high-voltage reference voltage source and the other end connected to the drain of the first transistor; a first current limiting module having one end connected to the source of the fourth transistor and the other end connected to the low-voltage ground reference voltage source; and the second level shift module comprises: a fifth transistor having a gate connected to the second signal output terminal and a source connected to a low-voltage reference voltage source; a sixth transistor having a gate connected to its drain and a source connected to a high-voltage ground reference voltage source; a seventh transistor having a gate connected to the gate of the sixth transistor, a source connected to the high-voltage ground reference voltage source, and a drain connected to the drain of the fifth transistor and the second signal output terminal; an eighth transistor having a gate connected to the a first complementary signal input terminal for inputting a first complementary signal and a drain connected to the drain of the sixth transistor, wherein the first complementary signal is complementary to the first input signal; a second clamping module having one end connected to the high-voltage ground reference voltage source and the other end connected to the drain of the fifth transistor; a second current limiting module having one end connected to the source of the eighth transistor and the other end connected to the low-voltage reference voltage source.

Preferably, the drive module comprises a first drive transistor and a second drive transistor, wherein the first drive transistor has a gate connected to the first signal output terminal, a source connected to the high-voltage reference voltage source, and a drain connected to the drive signal output terminal; and the second drive transistor has agate connected to the second signal output terminal, a source connected to the high-voltage ground reference voltage source, and a drain connected to the drain of the first drive transistor.

Preferably, the first clamping module and the second clamping module are composed of one or more transistors connected in series.

Preferably, the first current limiting module and the second current limiting module are composed of resistors.

Preferably, each of the first transistor, the second transistor, the third transistor, the fourth transistor, the fifth transistor, the sixth transistor, the seventh transistor and the eighth transistor is a LDMOS transistor.

Preferably, each of the one or more transistors is a LDMOS transistor.

The level shift circuit of the present invention can be applicable for the requirements of the BCD process and prevent damages to the high-voltage devices due to the excessively high gate voltage, and thus the shift between the high and low levels in the channel is effectively realized.

BRIEF DESCRIPTION OF DRAWINGS

FIG. 7 is the timing charts of respectively related signals in the level shift circuit of the present invention.

DETAILED DESCRIPTION OF THE SPECIFIC EMBODIMENTS

The composition and operating principle of the level shift circuit of the present invention will be described in detail as below, with reference to the drawings and the specific embodiments.

Figure 1:
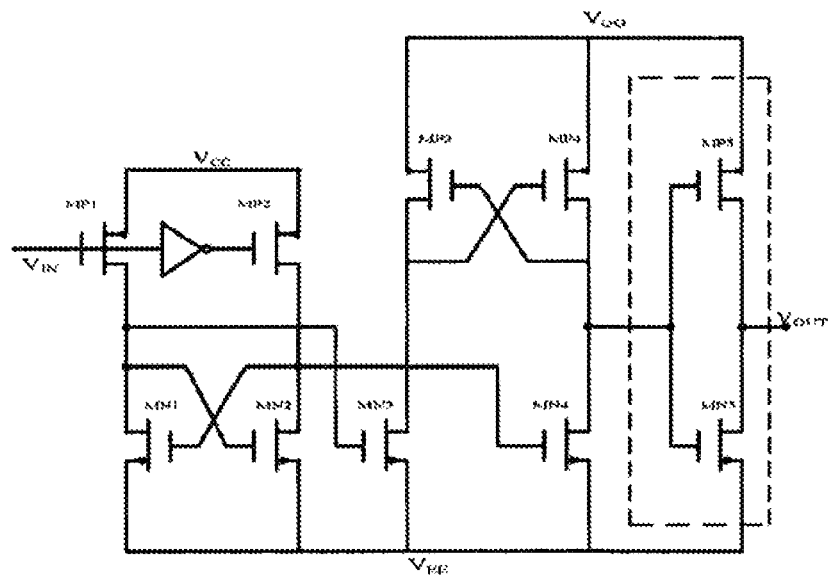
FIG. 1 is a circuit diagram of a level shift circuit in the prior art.
Figure 2:
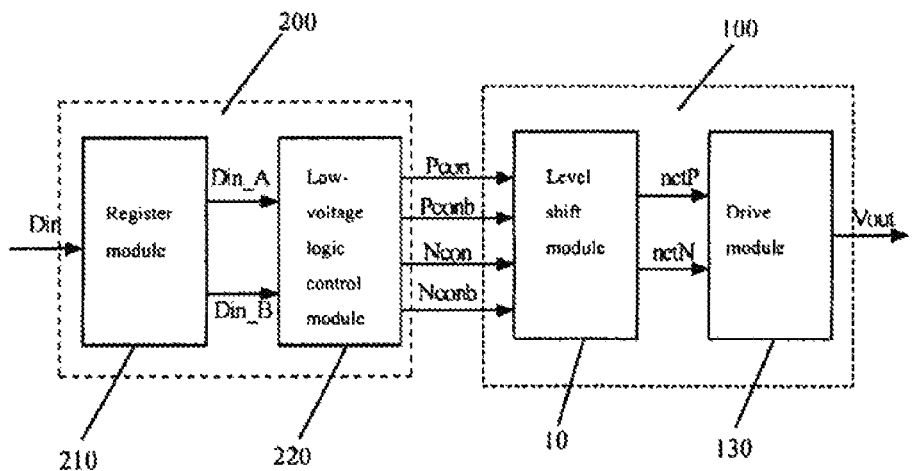
FIG. 2 is a diagram of circuit modules of one output channel including the level shift circuit of the present invention.

As shown in FIG. 2, a schematic view of circuit modules of one output channel including the level shift circuit of the present invention is shown. As shown in FIG. 2, one output channel circuit comprises a low-voltage circuit 200 and a high-voltage circuit 100 (i.e. the level shift circuit portion of the present invention). A low-voltage input signal from the low-voltage circuit portion 200 generates a drive signal for driving the high-voltage circuit via a logic control module, and the level shill circuit of the high-voltage portion realizes the functions of shifting of the levels from low voltage to high voltage and driving the high-voltage load. Specifically, the input signal Din, after passing through the register module 210, generates two signals: Din_A and Din_B. The two signals, after passing through a low-voltage logic control module 220, may generate a first input signal Pcon and a second input signal Ncon, which are used for the high-voltage level shill circuit portion 100, and a first complementary signal Pconb which is reversely complementary to the first input signal Pcon and a second complementary signal Nconb which is reversely complementary to the second input signal Ncon. The above input signals go through a level shill module 10 (including the first level shift module 110 and the second level shift module 120, see FIG. 3 for details) of the level shift circuit, and then high-voltage signals netP and netN are generated, and a high-voltage signal Vout for outputting to the subsequent display assemblies is generated via a drive module 130.

In terms of the relationship among the above-mentioned signals, Din is a signal output from the (N−1)th level of a shift register, and it generates the Nth and (N+1)th levels of the shift register output signals Din_A and Din_B. In the level shift circuit of the present invention, Din_A functions to control the levels of the circuit to shift from low to high, so that the output Vout is set to the high level. Din_B in the circuit of the present invention functions to pull down the Vout after the shift pulse of the circuit is shifted from a high level to a low level. Further, Pcon and Pconb are generated from Din-A by combinational logic (see FIG. 7 for the timing relationship), and the above function of Din_A is achieved by controlling the operation of the level shift circuit of the present invention via Pcon and Pconb. Ncon and Nconb are generated from Din_B by combinational logic, and the function of Din_B is realized by controlling the operation of the level shift circuit of the present invention via Ncon and Nconb. More specific explanation will be made in the following detailed description of the level shift circuit of the present invention.

Figure 3:
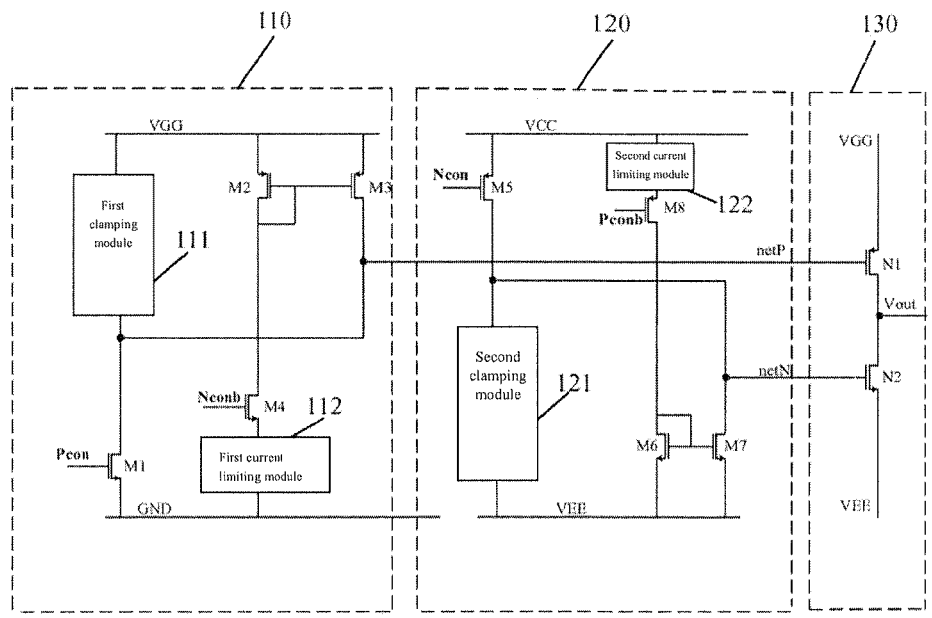
FIG. 3 is a circuit diagram of the level shift circuit of the present invention.

As shown in FIG. 3, a specific circuit diagram of the above level shift circuit of the present invention is shown. As shown in the figure, the level shift circuit 100 comprises: a first level shift module 110; a first signal input terminal Pcon for providing a first input signal for the first level shift module 110; a first signal output terminal netP for providing output from the first level shift module 110; a second level shift module 120; a second signal input terminal Ncon for providing a second input signal for the second level shift module 120; a second signal output terminal netN for providing output from the second level shift module 120; a drive module 120 connected to the first signal output terminal netP and the second signal output terminal netN; and a drive signal output terminal Vout from the drive module 120.

More specifically, the first level shift module 110 comprises: a first transistor M1 having a gate connected to the first signal output terminal Pcon and a source connected to a low-voltage ground reference voltage source GND; a second transistor M2 having a gate connected to its drain and a source connected to a high-voltage reference voltage source VGG; a third transistor M3 having a gate connected to the gate of the second transistor M2, a source connected to the high-voltage reference voltage source VGG, and a drain connected to the drain of the first transistor M1 and the first signal output terminal netP; a fourth transistor M4 having a gate connected to the second complementary signal input terminal Nconb for inputting the second complementary signal and a drain connected to the drain of the second transistor M2, wherein the second complementary signal is reversely complementary to the second input signal (see FIG. 7); a first clamping module 111 having one end connected to the high-voltage reference voltage source VGG and the other end connected to the drain of the first transistor M1; a first current limiting module 112 having one end connected to the source of the fourth transistor M4 and the other end connected to the low-voltage ground reference voltage source GND.

On the other hand, the second level shift module 120 comprises: a fifth transistor M5 having a gate connected to the second signal Output terminal Ncon and a source connected to a low-voltage reference voltage source VCC; a sixth transistor M6 having a gate connected to its drain and a source connected to a high-voltage ground reference voltage source VEE; a seventh transistor M7 having a gate connected to the gate of the sixth transistor M6, a source connected to the high-voltage ground reference voltage source VEE, and a drain connected to the drain of the fifth transistor M5 and the second signal output terminal netN; an eighth transistor M8 having a gate connected to the first complementary signal input terminal Pconb for inputting the first complementary signal and a drain connected to the drain of the sixth transistor M6, wherein the first complementary signal and the first input signal are reversely complementary (see FIG. 7); a second clamping module 121, having one end connected to the high-voltage ground reference voltage source VEE and the other end connected to the drain of the fifth transistor M5; and a second current limiting module 122, having one end connected to the source of the eighth transistor M8 and the other end connected to the low-voltage reference voltage source VCC.

Each of the above transistors from the first to the eighth transistors M1-M8 is a LDMOS transistor. The high-voltage reference voltage source VGG and the high-voltage ground reference voltage source VEE correspond to 40V power supply/ground of the high-voltage portion, respectively; the low-voltage reference voltage source VCC and the low-voltage ground reference voltage source GND correspond to 1.8V power/ground of the low-voltage portion, respectively.

In addition, the drive module 130 comprises a first drive transistor N1 and a second drive transistor N2. Both transistors are LDMOS transistors, wherein the first drive transistor N1 has a gate connected to the first signal output terminal netP, a source connected to the high-voltage reference voltage source VGG, and a drain connected to the drive signal output terminal Vout; and the second drive transistor N2 has agate connected to the second signal output terminal netN, a source connected to the high-voltage ground reference voltage source VEE, and a drain connected to the drain of the first drive transistor N1.

Figure 4:
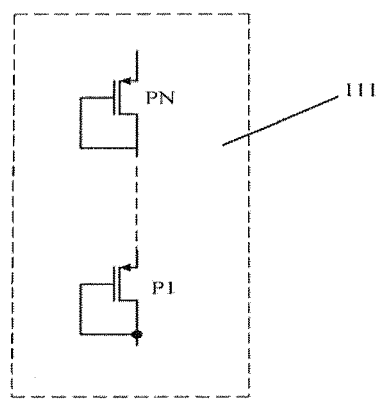
FIG. 4 is a circuit diagram of the first clamping module in FIG. 3.
Figure 5:
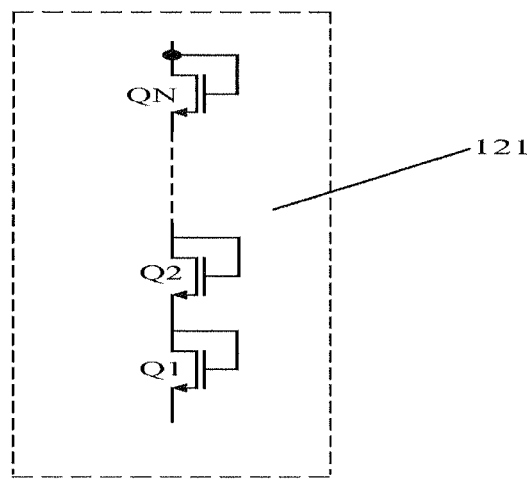
FIG. 5 is a circuit diagram of the second clamping module in FIG. 3.

As shown in FIGS. 4 and 5, the first clamping module 111 and the second clamping module 121 are composed of one or more transistors P1-PN and Q1-QN connected in series. Each of P1-PN and Q1-QN is a LDMOS transistor device, wherein the drains and sources of each of the serially connected transistors are sequentially connected, and the gate of each transistor is connected to the drain thereof. The number of the transistors in the first clamping module 111 and the second clamping module 121 varies according to the difference in the clamp voltages. In addition, the transistors within the two clamping modules are preferably composed of LDMOS transistors; however, the semiconductor devices such as triodes or diodes can also be used to achieve the clamping function.

The first current limiting module 112 and the second current limiting module 122 are composed of resistors. Of course, other current limiting devices or circuits may also be used. For example, transistor devices can be used to realize the current limiting function of the two current limit modules.

Figure 6:
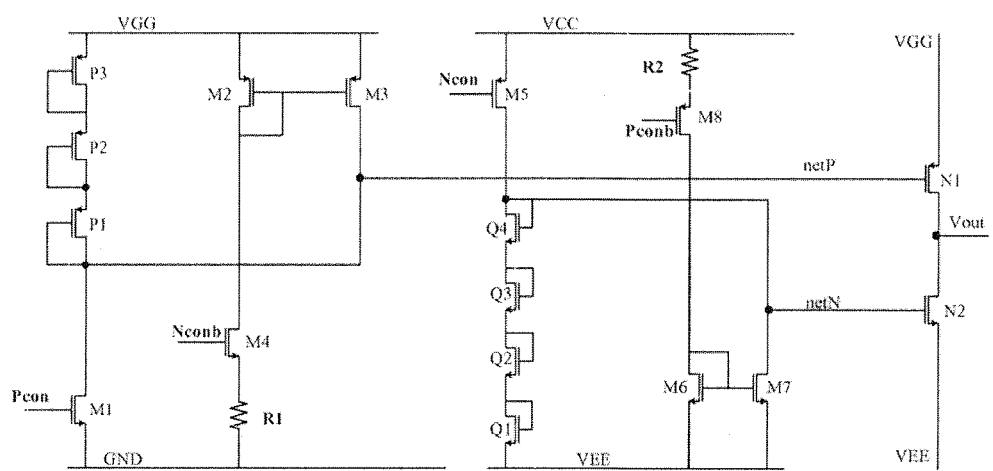
FIG. 6 is a circuit diagram of one embodiment of the level shift circuit of the present invention.

As shown in FIG. 6, a more detailed circuit diagram illustrating the first clamping module 111, a second clamping module 121, a first current limiting module 112, and a second current limiting module 122 in the level shift circuit of the present invention is shown. In this embodiment, the first clamping module 111 comprises three transistors P1, P2, and P3 sequentially connected in series, and the second clamping module 121 comprises four transistors Q1, Q2, Q3, and Q4 sequentially connected in series. The drain of the transistor P1 is connected to the drain of the first transistor M1, the source of the transistor P3 is connected to the high-voltage reference voltage source VGG, the source of Q1 is connected to the high-voltage ground reference voltage source VEE, and the drain of Q5 is connected to the drain of the fifth transistor M5. The circuit structures of other parts are the same as that in FIG. 3.

Hereinafter, the operating principle of the level shift circuit of the present invention will be described in detail with reference to FIGS. 6 and 7. FIG. 7 illustrates the timing charts of the signals at the respective input or output terminals Din, Din_A Din_B, Pcon, Pconb, Ncon, Nconb, netP, netN and Vout.

In FIG. 6, M1-M3, P1-P3 and M5-M7, and Q1~Q4 function to remove the limitation that the gates of the first drive transistor N1 and the second drive transistor N2 in the drive module 130 cannot bear high voltage, that is, to ensure:

$$VGG - V_{netP} \le V_T, V_{netN} - VEE \le V_T \quad \text{(Equation 1)}$$

wherein, $V_T$ is the gate-source voltage that the high-voltage devices can bear at most; $V_{netP}$ is the voltage at the first signal output terminal netP; $V_{netN}$ is the voltage at the second signal output terminal netN. Taking the voltage $V_{netP}$ at netP as an example, the amplitude of the signal received by the gate of the first transistor M1 is GND~VCC. When the first input signal voltage $V_{Pcon}$ at the first signal input terminal Pcon is equal to VCC, the first transistor M1 is turned on and a saturation current $I_{M1}$ is generated. The three transistors P1, P2, P3 in the first clamping module 111 are commensurate to three resistors connected in series, so that the voltage at the first signal output terminal netP is:

$$V_{netP} = V_{GG} - I_{M1} \times (R_{on1} + R_{on2} + R_{on3}) \quad \text{(Equation 2)}$$

wherein, $R_{ON1}$, $R_{ON2}$ and $R_{ON3}$ are respectively the on-resistances of P1, P2 and P3. The voltage at netP can meet the requirements of Equation 1 by adjusting the width to length ratios of M1, P1, P2, and P3, When the first input signal voltage $V_{Pcon}$ at the first signal input terminal Pcon is equal to GND, the first transistor M1 is turned off, and the first signal output terminal netP is charged to a higher voltage to turn off the first drive transistor N1. However, in fact, although the first transistor M1 has the same gate and source voltages at this time, there is a weak drain current in M1. The voltage drop of this portion of drain current on the P1~P3 can easily make the first drive transistor N1 in the sub-threshold area and not completely be turned off, which greatly increases the transient response time of the output level. Such situation can be avoided by the introduction of transistors M2~M4. Specifically, when the first transistor M1 is turned off, the input signal Nconb at the second complementary signal input terminal can control the fourth transistor M4 to be turned on, and the saturation current $I_{M4}$, thus generated, flows through the second transistor M2 so as to provide a turn-on voltage for the gate of the third transistor M3. At this time, the third transistor M3 is in the linear area, no that the voltage at netP is very close to VGG, and thus the first drive transistor N1 is completely turned off Similarly, at netN, the introduction of M5, MG, M8, and Q1~Q4 can also meet the requirements of equation (1). In terms of timing sequence, with reference to FIG. 7, when the first transistor M1 and the eighth transistor M8 are simultaneously turned on, the voltage at netP drops from the high voltage and high-level VGG via the first clamping module 111, and the voltage at netN is reduced to the high voltage and low-level VEE. At this time, the first drive transistor N1 is turned on while the second drive transistor N2 is completely cut off, the output of Vout is a high-voltage VGG, and the channel charges the load. On the other hand, the fourth transistor M4 and the fifth transistor M5 are simultaneously turned on, then the voltage at netP becomes high-voltage and high-level VGG, and the voltage at netN is increased from high-voltage and low-level VEE via the second clamping module 121. Meanwhile, the first drive transistor N1 is completely cut off while the second drive transistor N2 is turned on, the output of Vout is the high voltage and low-level VEE, and the Channel discharges the load.

To sum up, the level shift circuit of the present invention can he applicable For the requirements of the BCD process and prevent damages to the high-voltage, device due to the excessively high gate voltage, and thus the shift between the high and low levels in the channel is effectively realized.

The invention claimed is:

1. A level shift circuit, characterized in that, the level shift circuit comprising:
a first level shift module;
a first signal input terminal for providing a first input signal for the first level shift module;
a first signal output terminal for providing output from the first level shift module;
a second level shift module;
a second signal input terminal for providing a second input signal for the second level shift module;
a second signal output terminal for providing output from the second level shift module;
a drive module connected to the first signal output terminal and the second signal output terminal; and
a drive signal output terminal from the drive module;
wherein, the first level shift module comprises:
a first transistor having a gate connected to the first signal output terminal and a source connected to a low-voltage ground reference voltage source;
a second transistor having a gate connected to its drain and a source connected to a high-voltage reference voltage source;
a third transistor having a gate connected to the gate of the second transistor, a source connected to the high-voltage reference voltage source, and a drain connected to the drain of the first transistor and the first signal output terminal;
a fourth transistor having a gate connected to a second complementary signal input terminal for inputting a second complementary signal and a drain connected to the drain of the second transistor, wherein the second complementary signal is complementary to the second input signal;
a first clamping module having one end connected to the high-voltage reference voltage source and the other end connected to the drain of the first transistor;
a first current limiting module having one end connected to the source of the fourth transistor and the other end connected to the low-voltage ground reference voltage source;
the second level shift module comprises:
a fifth transistor having a gate connected to the second signal output terminal and a source connected to a low-voltage reference voltage source;
a sixth transistor having a gate connected to its drain and a source connected to a high-voltage ground reference voltage source;
a seventh transistor having a gate connected to the gate of the sixth transistor, a source connected to the high-voltage ground reference voltage source, and a drain connected to the drain of the fifth transistor and the second signal output terminal;
an eighth transistor having a gate connected to a first complementary signal input terminal for inputting a first complementary signal and a drain connected to the drain of the sixth transistor, wherein the first complementary signal is complementary to the first input signal;
a second clamping module having one end connected to the high-voltage ground reference voltage source and the other end connected to the drain of the fifth transistor;
a second current limiting module having one end connected to the source of the eighth transistor and the other end connected to the low-voltage reference voltage source.

2. The level shift circuit according to claim 1, characterized in that, the drive module comprises a first drive transistor and a second drive transistor, wherein:
the first drive transistor has a gate connected to the first signal output terminal, a source connected to the high-voltage reference voltage source, and a drain connected to the drive signal output terminal; and
the second drive transistor has a gate connected to the second signal output terminal, a source connected to the high-voltage ground reference voltage source, and a drain connected to the drain of the first drive transistor.

3. The level shift circuit according to claim 2, characterized in that, the first clamping module and the second clamping module are composed of one or more transistors connected in series.

4. The level shift circuit according to claim 2, characterized in that, the first current limiting module and the second current limiting module are composed of resistors.

5. The level shift circuit according to claim 2, characterized in that, each of the first transistor, the second transistor, the third transistor, the fourth transistor, the fifth transistor, the sixth transistor, the seventh transistor, and the eighth transistor is a LDMOS transistor.

6. The level shift circuit according to claim 1, characterized in that, the first clamping module and the second clamping module are composed of one or more transistors connected in series.

7. The level shift circuit according to claim 6, characterized in that, each of the one or more transistors is a LDMOS transistor.

8. The level shift circuit according to claim 1, characterized in that, the first current limiting module and the second current limiting module are composed of resistors.

9. The level shift circuit according to claim 1, characterized in that, each of the first transistor, the second transistor, the third transistor, the fourth transistor, the fifth transistor, the sixth transistor, the seventh transistor, and the eighth transistor is a LDMOS transistor.

* * * * *